United States Patent [19]
Teo et al.

[11] Patent Number: 6,103,569
[45] Date of Patent: Aug. 15, 2000

[54] METHOD FOR PLANARIZING LOCAL INTERCONNECTS

[75] Inventors: Kok Hin Teo; Feng Chen, both of Singapore, Singapore; Lap Chan, San Francisco, Calif.

[73] Assignee: Chartered Semiconductor Manufacturing Ltd., Singapore, Singapore

[21] Appl. No.: 09/459,730

[22] Filed: Dec. 13, 1999

[51] Int. Cl.[7] .................................................. H01L 21/8242
[52] U.S. Cl. ...................... 438/253; 438/256; 438/396; 438/399; 438/643; 438/688
[58] Field of Search .................... 438/636, 697, 438/424, 425, 426, 435, 437, 296, 221, 692, 633, 253–256, 396, 399, 643, 653, 688

[56] References Cited

U.S. PATENT DOCUMENTS

| 5,552,344 | 9/1996 | Jang et al. ............................... 437/195 |
| 5,578,523 | 11/1996 | Fiordalice et al. ...................... 437/190 |
| 5,726,099 | 3/1998 | Jaso ......................................... 438/693 |
| 5,804,084 | 9/1998 | Nasby et al. ............................... 216/2 |
| 5,837,612 | 11/1998 | Ajuria et al. ............................. 438/697 |
| 5,858,813 | 1/1999 | Scherber et al. ......................... 438/693 |
| 5,910,022 | 6/1999 | Weling ..................................... 438/692 |
| 5,916,855 | 6/1999 | Avanzino et al. ......................... 51/307 |
| 5,960,320 | 9/1999 | Park ......................................... 438/688 |
| 6,023,102 | 2/2000 | Nguyen et al. ........................... 257/774 |
| 6,037,213 | 3/2000 | Shih et al. ................................ 438/253 |

*Primary Examiner*—Matthew Smith
*Assistant Examiner*—Victor Yevsikov
*Attorney, Agent, or Firm*—George O. Saile; Rosemary L. S. Pike; William J. Stoffel

[57] ABSTRACT

A method for planarizing metal plugs for device interconnections. The process begins by providing a semiconductor structure with at least one device thereon. A dielectric layer is formed over the device and the semiconductor structure. A first barrier metal layer is formed on the dielectric layer, and a sacrificial oxide layer is formed on the first barrier metal layer. The sacrificial oxide layer, the first barrier metal layer, and the dielectric layer are patterned to form contact openings. A second barrier metal layer is formed over the semiconductor structure, and a metal contact layer is formed on the second barrier metal layer. The metal contact layer and the second barrier metal layer are planarized using a first chemical mechanical polishing process and the sacrificial oxide layer is removed. The metal contact layer and the first barrier metal layer are planarized using a second chemical mechanical polishing process.

14 Claims, 4 Drawing Sheets

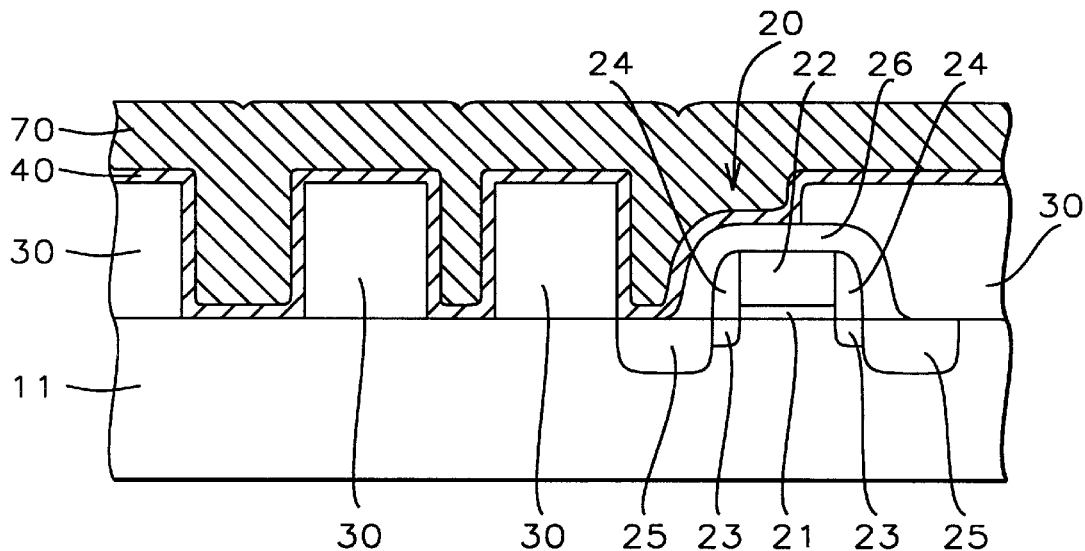
FIG. 1 – Prior Art
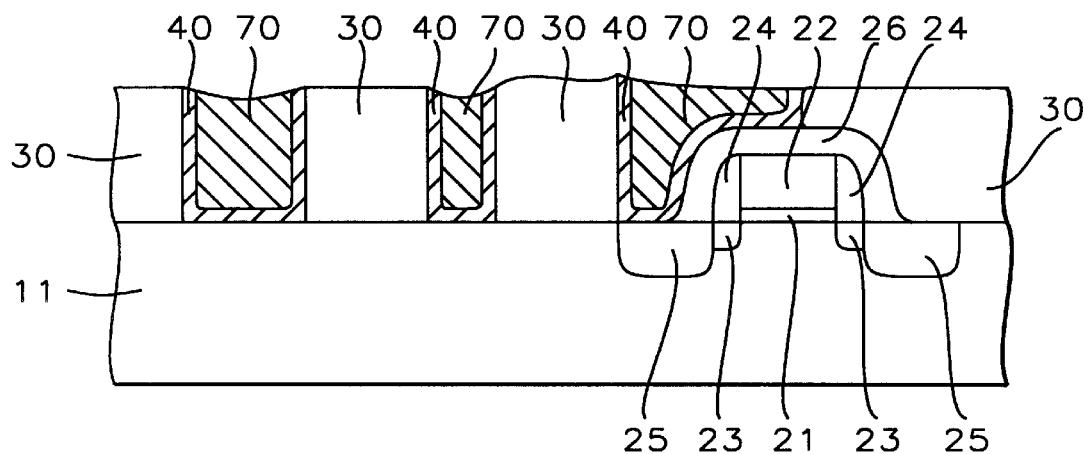
FIG. 2 – Prior Art

METHOD FOR PLANARIZING LOCAL INTERCONNECTS

BACKGROUND OF THE INVENTION

1) Field of the Invention

This invention relates generally to fabrication of a semiconductor device and more particularly to a method for planarizing metal contacts for local interconnects.

2) Description of the Prior Art

As the physical geometry of semiconductor devices continues to shrink, metal damascene processes play an important role in forming contacts for local interconnects. In a typical metal damascene process, a dielectric layer (eg ILD) is formed over a semiconductor structure and one more devices. The dielectric layer is patterned to form contact openings. A barrier layer is deposited over the semiconductor structure, and a contact layer, composed of a metal such as tungsten, is deposited on the barrier layer. The contact layer and the barrier layer are planarized using a chemical mechanical polishing process (CMP).

However, the typical metal damascene process has several problems. Because the metal CMP is highly selective to the contact layer, more metal is removed in the middle of the contact than at the edges near the dielectric layer. This condition, which is known as dishing, can cause poor planarity and lead to higher contact resistance. Insufficient chemical mechanical polishing can leave metal residue causing shorting between interconnect lines. Excess chemical mechanical polishing can cause erosion of the dielectric layer, reducing the step height of the dielectric layer.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,837,612 (Ajuria et al.) shows a method for forming a shallow trench isolation (STI) with reduced erosion by forming polysilicon oxide layers on the sidewalls and top corners of an STI structure. Since the polysilicon oxide layers have a slower etch rate than TEOS oxide, which forms the bulk of the STI structure, STI erosion is reduced.

U.S. Pat. No. 5,910,022 (Weling) and U.S. Pat. No. 5,726,099 (Jasco) show chemical mechanical polishing processes which remove metal over a dielectric layer and simultaneously planarize the dielectric layer by using a slurry which provides approximately equal selectivity of metal and dielectric.

U.S. Pat. No. 5,916,855 (Avanzino et al.) shows a tungsten and titanium nitride chemical mechanical polishing process.

U.S. Pat. No. 5,578,523 (Fiodalice et al.) shows a dual damascene chemical mechanical polishing process.

U.S. Pat. No. 5,858,813 (Scherber et al.) teaches a chemical mechanical polishing slurry with high selectivity of metal to silicon dioxide.

U.S. Pat. No. 5,804,084 (Nasby et al.) shows a chemical mechanical polishing process for planarizing sacrificial oxide layers in a micromachining process.

SUMMARY OF THE INVENTION

It is an object of the present invention to provide a method for planarizing contact plugs for device interconnections eliminates metal residue.

It is another object of the present invention to provide a method for planarizing metal contact plugs for device interconnections which reduces dishing.

It is another object of the present invention to provide a method for planarizing contact plugs for device interconnections which reduces oxide erosion.

It is yet another object of the present invention to provide a method for planarizing metal contact plugs for device interconnects with reduced contact resistance.

To accomplish the above objectives, the present invention provides a method for planarizing metal contacts for device interconnections. The process begins by providing a semiconductor structure with at least one device thereon. A dielectric layer is formed over the device and the semiconductor structure. A first barrier metal layer is formed on the dielectric layer, and a sacrificial oxide layer is formed on the first barrier metal layer. The sacrificial oxide layer, the first barrier metal layer, and the dielectric layer are patterned to form contact openings. A second barrier metal layer is formed over the semiconductor structure, and a metal contact layer is formed on the second barrier metal layer. The metal contact layer and the second barrier metal layer are planarized using a first chemical mechanical polishing process and the sacrificial oxide layer is removed. The metal contact layer and the first barrier metal layer are planarized using a second chemical mechanical polishing process.

The present invention provides considerable improvement over the prior art. Because the second CMP process has a very short duration with a small down pressure and a slow speed, dishing is reduced significantly compared to prior art CMP processes. Also, the minimal duration of the second CMP process and the high selectivity of the second CMP process to oxide reduce oxide erosion. The selectivity of the second CMP process also helps to eliminate metal contamination.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 and 2 illustrate sequential sectional views of a process for forming contacts for interconnections known by the inventors to have problems.

DETAILED DESCRIPTION OF THE INVENTION

Figure 3:
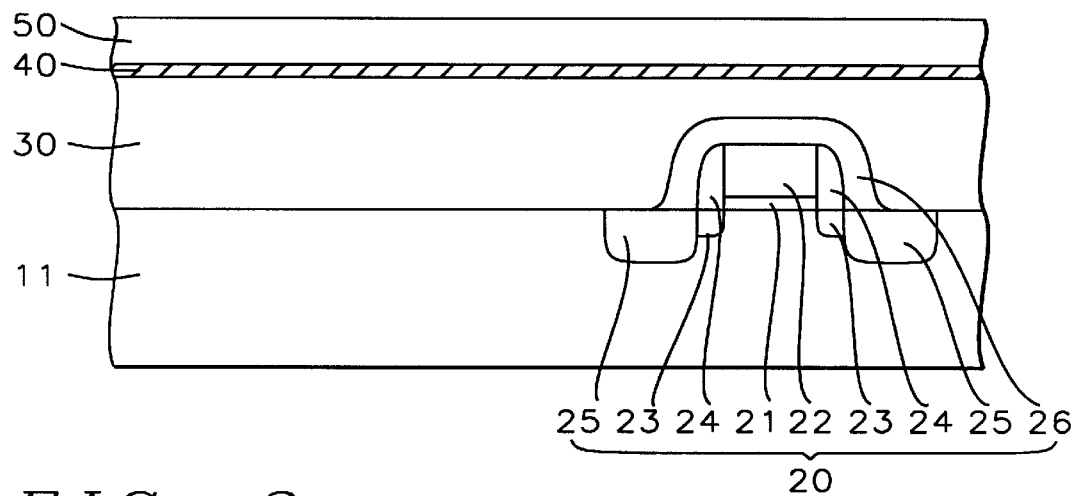
FIG. 3 through 8 illustrate sequential sectional views of a process for forming contacts for interconnections according to the present invention.

The present invention will be described in detail with reference to the accompanying drawings. The present invention provides a method for planarizing contact plugs for device interconnections.

PROBLEM IDENTIFIED BY THE INVENTORS

FIGS. 1 & 2

Referring to FIG. 1, a problem process known to the inventors begins by providing a semiconductor structure (11), having one or more devices (20) thereon. As illustrated in FIG. 1, the device can be a gate (20) comprising a gate dielectric (21), a gate electrode (22), lightly doped source and drain regions (23), sidewall spacers (24), source and drain regions (25), and a hard mask (26) as is known in the art.

Still referring to FIG. 1, a dielectric layer (30) is formed over the semiconductor structure (11) and the device (20). The dielectric layer (30) (eg interlevel dielectric layer, ILD) can be composed of a variety of dielectrics including silicon dioxide, an oxide/nitride stack, or most preferably boron and phosporous doped spin on glass (BPSG). The dielectric layer (30) is preferably formed to a thickness of between about 4000 Angstroms and 6000 Angstroms.

Still referring to FIG. 1, a barrier layer (40) is formed over the semiconductor structure (11) and a metal contact layer (70) is formed on the barrier layer (40). The barrier layer (40) is typically composed of titanium nitride having a thickness of between about 500 Angstroms and 1500 Angstroms. The metal contact layer (70) can be composed of a variety of low resistance metals including tungsten, aluminum, and copper, and preferably has a thickness of between about 4000 Angstroms and 6000 Angstroms.

Referring to FIG. 2, the metal contact layer (70) and the barrier layer (40) are planarized using a chemical mechanical polishing (CMP) process to form contact plugs. The inventors have identified several problems with this process. Because the metal CMP is highly selective to the metal contact layer (70), more metal is removed in the middle of the contact plug than at the edges near the dielectric layer (30). This condition, which is known as dishing, can cause poor planarity and lead to higher contact resistance. Also, insufficient chemical mechanical polishing can leave metal residue causing shorting between interconnect lines. Whereas, excess chemical mechanical polishing can cause erosion of the dielectric layer (30), reducing the step height of the dielectric layer.

PREFERRED EMBODIMENT OF THE PRESENT INVENTION

FIGS. 3 Through 8

Referring to FIG. 3, the preferred embodiment of the present invention begins by providing a semiconductor structure (11). Semiconductor structure (11) should be understood to possibly include a wafer of semiconducting material, such as silicon, or a substrate comprising a polysilicon structure or a silicon-on-insulator (SOI) structure as is known in the art. Semiconductor structure (11) should be understood to possibly further include one or more insulating and/or conductive layers overlying the substrate or the like, and one or more active and/or passive devices formed in or over the substrate or the like.

As shown in FIG. 3, one or more devices (20) are formed on the semiconductor structure (11). Typically, some or all of these devices would be transistors comprising a gate dielectric (21), a gate electrode (22), lightly doped source and drain regions (23), sidewall spacers (24), source and drain regions (25), and a hard mask (26) as is known in the art.

Still referring to FIG. 3, a dielectric layer (30) is formed over the semiconductor structure (11). The dielectric layer (30) is preferably composed of boron and phosphorous doped spin on glass, having a thickness of between about 4000 Angstroms and 6000 Angstroms.

Still referring to FIG. 3, a first barrier metal layer (40) is formed on the dielectric layer (30). The barrier metal layer (40) preferably comprises titanium nitride having a thickness of between about 500 Angstroms and 1500 Angstroms.

Still referring to FIG. 3, a sacrificial oxide layer (50) is formed on the first barrier metal layer (40). The sacrificial oxide layer (50) is preferably composed of TEOS oxide having a thickness of between about 1000 Angstroms and 2000 Angstroms.

Figure 4:
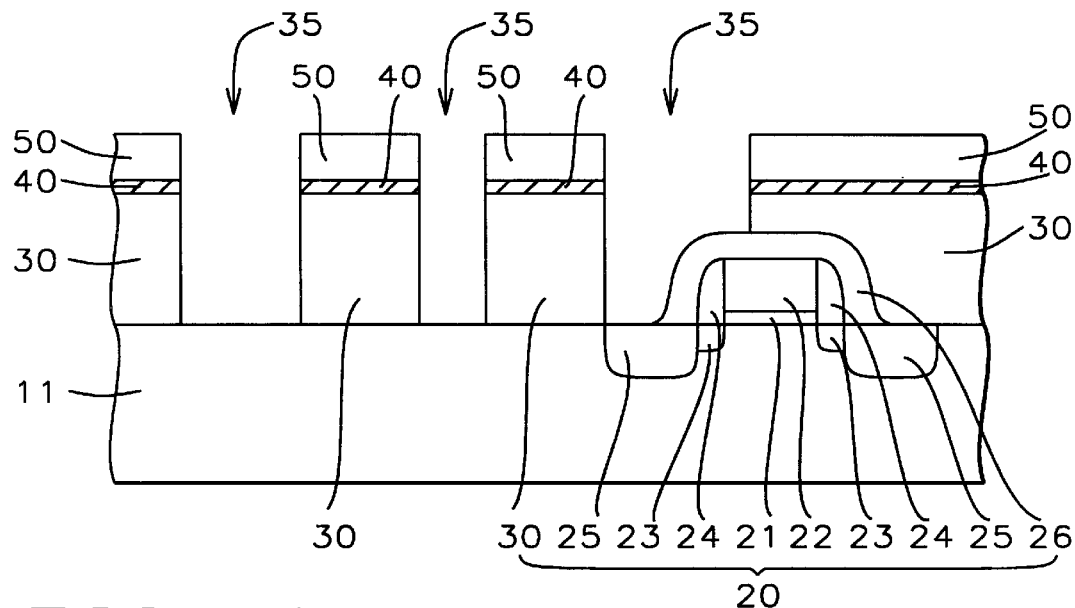

Referring to FIG. 4, the sacrificial oxide layer (50), the first barrier metal layer (40), and the dielectric layer (30) are patterned to form contact openings (35). The contact openings can be formed using photolithography (eg deposit photoresist, expose photoresist, develop photoresist, etch underlying layers through photoresist mask, and remove photoresist mask).

Figure 5:
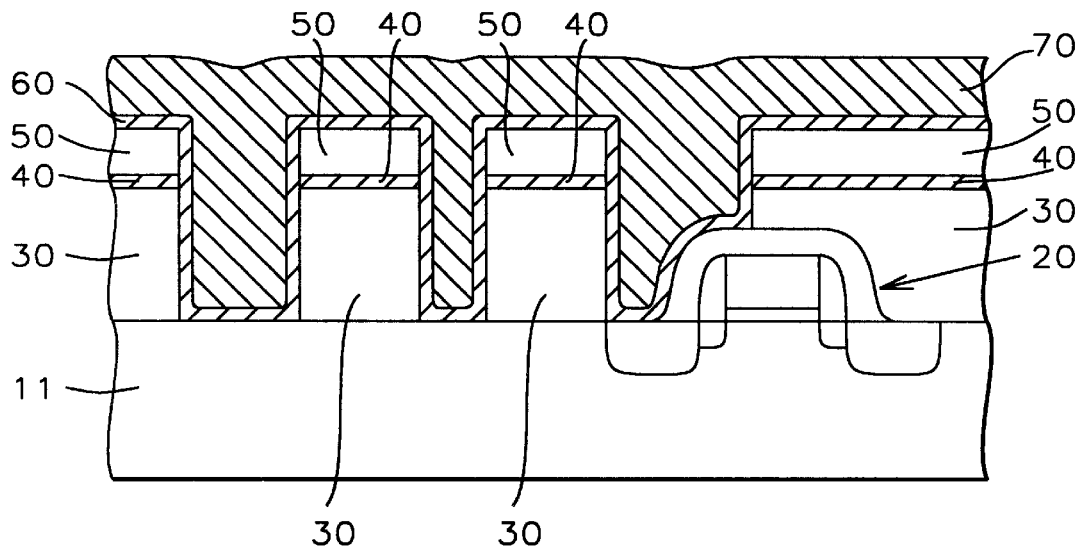

Referring to FIG. 5, a second barrier metal layer (60) is formed over the semiconductor structure (11), and a metal contact layer (70) is formed on the second barrier metal layer (60). The second barrier metal layer (60) preferably comprises titanium nitride having a thickness of between about 200 Angstroms and 500 Angstroms. The metal contact layer (70) can comprise copper, aluminum, or most preferably tungsten. The metal contact layer (70) preferably has a thickness of between about 4000 Angstroms and 6000 Angstroms.

Figure 6:
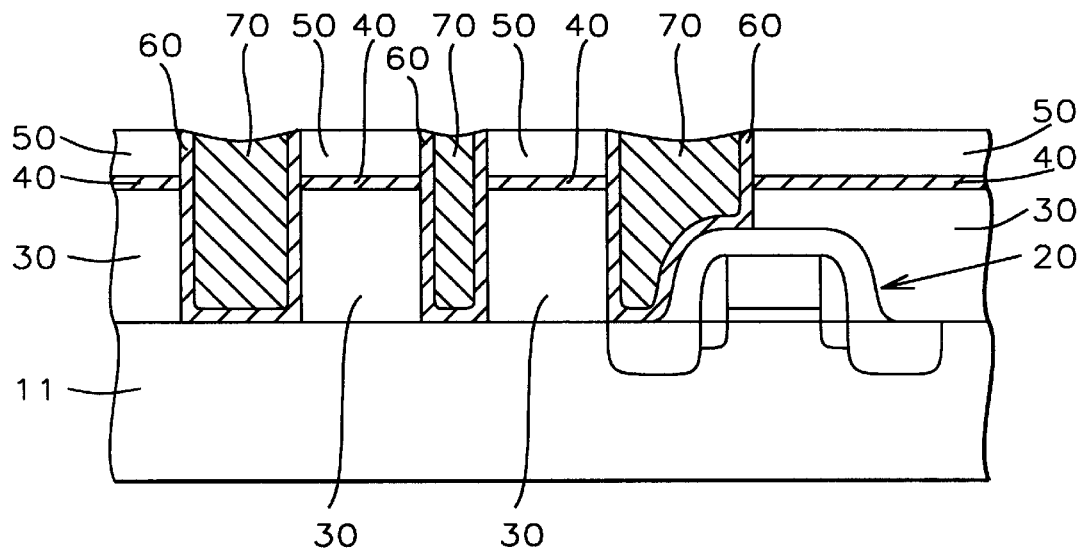

Referring to FIG. 6, the metal contact layer (70) and the second barrier metal layer (60) are planarized using a first chemical mechanical polishing (CMP) process. The first CMP process preferably uses endpoint detection to stop on the sacrificial oxide layer (50). As shown in FIG. 6, the first CMP process causing dishing in the metal contact layer (70).

Figure 7:
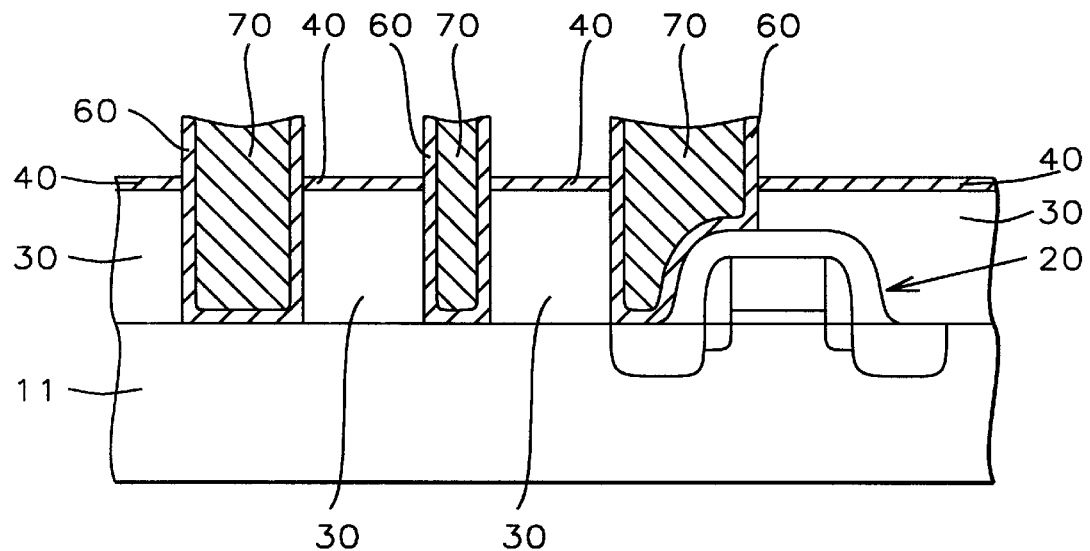

Referring to FIG. 7, the sacrificial oxide layer (50) is removed. The sacrificial oxide layer (50) is preferably removed using an isotropic etch which is selective to titanium nitride and tungsten (eg has a slower etch rate for titanium nitride and tungsten than for TEOS oxide), having a selectivity of about 30:1.

Figure 8:
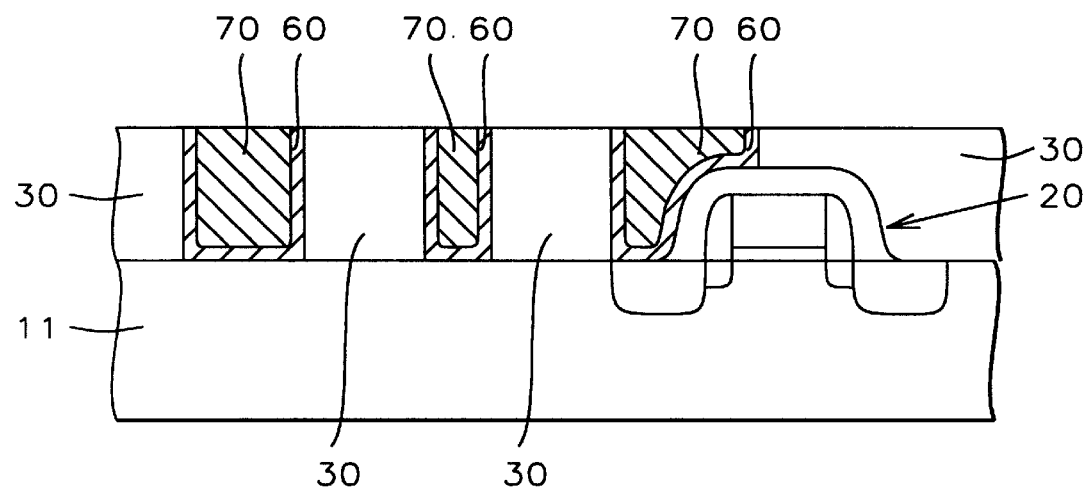

Referring to FIG. 8, the metal contact layer (70) and the first barrier metal layer (40) are planarized using a highly selective second chemical mechanical polishing process to form a contact plug. The second CMP process can be performed with a slurry comprising: ferric nitride, deoionized water, and silica abrasive (such as Rodel's MSW1500 or MSW2000) for tungsten polishing. Alternatively, a slurry comprising: $H_2O_2$, deionized water, and silica abrasive can be used for tungsten CMP. For copper CMP, a slurry comprising hydrogen peroxide, deionized water, and silica abrasive can be used. A small down force of between about 10,000 Pa and 20,000 Pa, and a slow speed of between about 10 revolutions/minute and 20 revolutions/minute for a time of between about 5 seconds and 20 seconds are preferably used for the second CMP process. The second CMP process has a selectivity to oxide such that the etch rate of tungsten is between about 21 and 27 times the etch rate of oxide, the etch rate of titanium nitride is between about 36 and 44 times the etch rate of oxide, and the etch rate of titanium is between about 8 and 12 times the etch rate of oxide.

The key advantages of the present invention are that because of the short duration and high selectivity of the second CMP process, dishing of the contact plug is reduced or eliminated. Also, oxide erosion is reduced or eliminated, and metal contamination is completely removed. Reducing or eliminating dishing and oxide erosion provides lower contact resistance and increased step height, further enhancing device performance.

While the invention has been particularly shown and described with reference to the preferred embodiments thereof, it will be understood by those skilled in the art that various changes in form and details may be made without departing from the spirit and scope of the invention.

What is claimed is:

1. A method for planarizing metal contact plugs, comprising the steps of:
 a. providing a semiconductor structure with at least one device thereon;
 b. forming a dielectric layer over said device and said semiconductor structure, forming a first barrier metal layer on said dielectric layer, and forming a sacrificial oxide layer on said first barrier metal layer;
 c. patterning said sacrificial oxide layer, said first barrier metal layer, and said dielectric layer to form contact openings;
 d. forming a second barrier metal layer over said semiconductor structure, and forming a metal contact layer on said second barrier metal layer;
 e. planarizing said metal contact layer and said second barrier metal layer using a first chemical mechanical polishing process, and removing said sacrificial oxide layer; and
 f. planarizing said metal contact layer and said first barrier metal layer using a second chemical mechanical polishing process.

2. The method of claim 1 wherein said sacrificial oxide layer comprises TEOS oxide having a thickness of between about 1000 Angstroms and 2000 Angstroms.

3. The method of claim 2 wherein said dielectric layer comprises boron and phosphorous doped spin on glass, said first barrier metal layer and said second barrier metal layer comprise titanium nitride, and said metal contact layer comprises tungsten.

4. The method of claim 3 wherein said second chemical mechanical polishing process has a selectivity of tungsten to boron and phosporous doped spin on glass of between about 21 and 27, a selectivity of titanium nitiride to boron and phosporous doped spin on glass of between about 36 and 44, and a selectivity of titanium to boron and phosporous doped spin on glass of between about 8 and 12.

5. The method of claim 4 wherein the second chemical mechanical polishing process is performed for a time of less than 20 seconds.

6. The method of claim 2 wherein the second chemical mechanical polishing process is performed for a time of less than 20 seconds.

7. The method of claim 1 wherein said dielectric layer comprises boron and phosphorous doped spin on glass, said first barrier metal layer and said second barrier metal layer comprise titanium nitride, and said metal contact layer comprises tungsten.

8. A method for planarizing metal contact plugs for device interconnections, comprising the steps of:
 a. providing a semiconductor structure with at least one device thereon;
 b. forming a dielectric layer over said device and said semiconductor structure;
 c. forming a first barrier metal layer on said dielectric layer; said first barrier metal layer comprising titanium nitride;
 d. forming a sacrificial oxide layer on said first barrier metal layer;
 e. patterning said sacrificial oxide layer, said first barrier metal layer, and said dielectric layer to form contact openings;
 f. forming a second barrier metal layer over said semiconductor structure, said second barrier metal layer comprising titanium nitride;
 g. forming a metal contact layer on said second barrier metal layer; said metal contact layer comprising tungsten;
 h. planarizing said metal contact layer and said second barrier metal layer using a first chemical mechanical polishing process;
 i. removing said sacrificial oxide layer; and
 j. planarizing said metal contact layer and said first barrier metal layer using a second chemical mechanical polishing process.

9. The method of claim 8 wherein said sacrificial oxide layer comprises TEOS oxide having a thickness of between about 1000 Angstroms and 2000 Angstroms.

10. The method of claim 9 wherein the second chemical mechanical polishing process is performed for a time of less than 20 seconds.

11. The method of claim 8 wherein said dielectric layer comprises boron and phosphorous doped spin on glass, said first barrier metal layer and said second barrier metal layer comprise titanium nitride, and said metal contact layer comprises tungsten.

12. The method of claim 11 wherein said dielectric layer comprises boron and phosphorous doped spin on glass, said first barrier metal layer and said second barrier metal layer comprise titanium nitride, and said metal contact layer comprises tungsten.

13. The method of claim 12 wherein said second chemical mechanical polishing process has a selectivity of tungsten to boron and phosporous doped spin on glass of between about 21 and 27, a selectivity of titanium nitiride to boron and phosporous doped spin on glass of between about 36 and 44, and a selectivity of titanium to boron and phosporous doped spin on glass of between about 8 and 12.

14. The method of claim 13 wherein the second chemical mechanical polishing process is performed for a time of less than 20 seconds.

* * * * *